(12) United States Patent
Park et al.

(10) Patent No.: US 10,212,808 B2
(45) Date of Patent: Feb. 19, 2019

(54) PRINTED CIRCUIT BOARD

(71) Applicant: Samsung Electronics Co., Ltd., Suwon-si, Gyeonggi-do (KR)

(72) Inventors: Iksung Park, Seoul (KR); Heeyoub Kang, Seoul (KR); Young-Min Kim, Seongnam-si (KR); Eunji You, Yongin-si (KR); Hwi-jong Yoo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 35 days.

(21) Appl. No.: 15/093,111

(22) Filed: Apr. 7, 2016

(65) Prior Publication Data

US 2017/0048970 A1 Feb. 16, 2017

(30) Foreign Application Priority Data

Aug. 11, 2015 (KR) .................. 10-2015-0113232

(51) Int. Cl.
| | |
|---|---|
| H05K 1/02 | (2006.01) |
| H05K 3/00 | (2006.01) |
| H01L 23/60 | (2006.01) |
| H01L 25/065 | (2006.01) |
| H01L 25/18 | (2006.01) |
| H01L 23/538 | (2006.01) |
| G11C 5/02 | (2006.01) |
| G11C 5/04 | (2006.01) |
| G11C 5/00 | (2006.01) |

(52) U.S. Cl.
CPC ........... *H05K 1/0259* (2013.01); *G11C 5/025* (2013.01); *G11C 5/04* (2013.01); *H01L 23/5386* (2013.01); *H01L 23/60* (2013.01); *H01L 25/0655* (2013.01); *H01L 25/18* (2013.01); *H05K 3/0052* (2013.01); *G11C 5/005* (2013.01); *H05K 1/0268* (2013.01); *H05K 2201/10159* (2013.01)

(58) Field of Classification Search
CPC ..... H05K 1/0259; H05K 3/0052; H01L 23/60
See application file for complete search history.

(56) References Cited

U.S. PATENT DOCUMENTS

| | | | | |
|---|---|---|---|---|
| 5,773,764 A | * | 6/1998 | von Vajna | G01R 31/2818 174/250 |
| 5,812,349 A | * | 9/1998 | Shouji | G11B 5/40 360/245.8 |
| 6,157,066 A | | 12/2000 | Kobayashi | |

(Continued)

FOREIGN PATENT DOCUMENTS

| | | |
|---|---|---|
| JP | 2005-099311 | 4/2005 |
| KR | 1020010036542 A | 5/2001 |

(Continued)

*Primary Examiner* — Nathan Milakovich
(74) *Attorney, Agent, or Firm* — Myers Bigel, P.A.

(57) ABSTRACT

Disclosed is a printed circuit board. The printed circuit board includes a plurality of insulation layers and a plurality of pattern layers alternately stacked. The printed circuit board includes a plurality of device areas on which semiconductor packages are mounted and a peripheral area adjacent the device areas. An electrostatic discharge pattern is in a respective pattern layer among the plurality of pattern layers and is disposed at a boundary region between a respective device area of the plurality of device areas and the peripheral area.

3 Claims, 13 Drawing Sheets

(56) References Cited

U.S. PATENT DOCUMENTS

| | | | |
|---|---|---|---|
| 6,373,709 B1* | 4/2002 | Hino | B82Y 10/00 |
| | | | 174/535 |
| 6,707,288 B2* | 3/2004 | Keating | G01R 31/2818 |
| | | | 324/756.02 |
| 7,087,452 B2* | 8/2006 | Joshi | H01L 23/585 |
| | | | 438/113 |
| 7,217,591 B2 | 5/2007 | Huang | |
| 7,333,346 B2* | 2/2008 | Miyagawa | H01L 22/32 |
| | | | 361/784 |
| 7,567,484 B2 | 7/2009 | Ochi | |
| 7,612,837 B2 | 11/2009 | Lo et al. | |
| 7,679,133 B2 | 3/2010 | Son et al. | |
| 7,952,167 B2* | 5/2011 | Lee | H01L 23/544 |
| | | | 257/618 |
| 8,462,308 B2* | 6/2013 | Tanahara | G02F 1/133351 |
| | | | 257/59 |
| 8,482,890 B2* | 7/2013 | Kim | H05K 1/185 |
| | | | 361/111 |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,866,020 B2* | 10/2014 | Ishii | H05K 1/0268 |
| | | | 174/250 |
| 9,299,612 B2* | 3/2016 | Wu | H01L 23/585 |
| 2008/0149382 A1* | 6/2008 | Karasawa | G01R 31/2805 |
| | | | 174/262 |
| 2009/0225269 A1* | 9/2009 | Lu | G02F 1/136204 |
| | | | 349/158 |
| 2010/0309602 A1 | 12/2010 | Chien | |
| 2011/0233648 A1 | 9/2011 | Seol et al. | |
| 2014/0016280 A1* | 1/2014 | Kim | H05K 1/18 |
| | | | 361/748 |
| 2015/0075844 A1* | 3/2015 | Kim | H05K 3/0097 |
| | | | 174/251 |
| 2015/0181695 A1* | 6/2015 | Ichinose | H05K 1/0268 |
| | | | 361/784 |
| 2016/0205782 A1* | 7/2016 | Ho | G01R 31/2818 |
| | | | 361/767 |
| 2017/0019985 A1* | 1/2017 | Sugimoto | H05K 1/0268 |

FOREIGN PATENT DOCUMENTS

| | | |
|---|---|---|
| KR | 1020050100919 A | 10/2005 |
| KR | 1020070077614 A | 7/2007 |

* cited by examiner

PRINTED CIRCUIT BOARD

CROSS-REFERENCE TO RELATED APPLICATIONS

A claim for priority under 35 U.S.C. § 119 is made to Korean Patent Application No. 10-2015-0113232 filed Aug. 11, 2015, in the Korean Intellectual Property Office, the entire contents of which are hereby incorporated by reference.

BACKGROUND

Embodiments of the inventive concepts described herein relate to a printed circuit board on which a semiconductor circuit is mounted.

As semiconductor manufacturing technology advances, a plurality of semiconductor circuits has been Manufactured in the form of a semiconductor integrated circuit. The semiconductor integrated circuit may be packaged into a semiconductor package and may be mounted on a printed circuit board to form a device. For example, semiconductor packages may be mounted on the printed circuit board to implement a variety of devices such as a scud state drive (SSD), a smart phone, a smart pad, a digital camera, or the like.

After the semiconductor packages are mounted on the printed circuit board to implement the devices, the devices are tested. The devices may be manufactured using a serially arranged printed circuit board (PCB) so as to reduce a test time of the devices. The semiconductor packages including two or more devices may be mounted on the serially arranged PCB. Afterwards, the two or more devices formed on the serially arranged PCB may be simultaneously tested, and the two or more devices may be manufactured by cutting the serially arranged PCB.

In the process of cutting the serially arranged PCB, the serially arranged PCB may experience a physical impact which may damage the semiconductor packages.

SUMMARY

Embodiments of the inventive concepts provide a printed circuit board which can discharge static electricity occurring in cutting a printed circuit board.

Embodiments of the inventive concepts provide a printed circuit board including a plurality of insulation layers and a plurality of pattern layers alternately stacked. The printed circuit board may include a plurality of device areas on which semiconductor packages are mounted and a peripheral area that is adjacent the plurality of device areas. An electrostatic discharge pattern may be in a respective pattern layer among the plurality of pattern layers and is at a boundary region that is between a respective device area of the plurality of device areas and the peripheral area.

Embodiments of the inventive concepts provide a printed circuit board including a device area upon which a semiconductor package may be mounted, a peripheral area adjacent the device area, and a bridge area between the device area and the peripheral area. The peripheral area may be configured to be physically separable from the device area. The bridge area may include an electrostatic discharge pattern that is configured to discharge static electricity when the peripheral area is physically separated from the device area.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
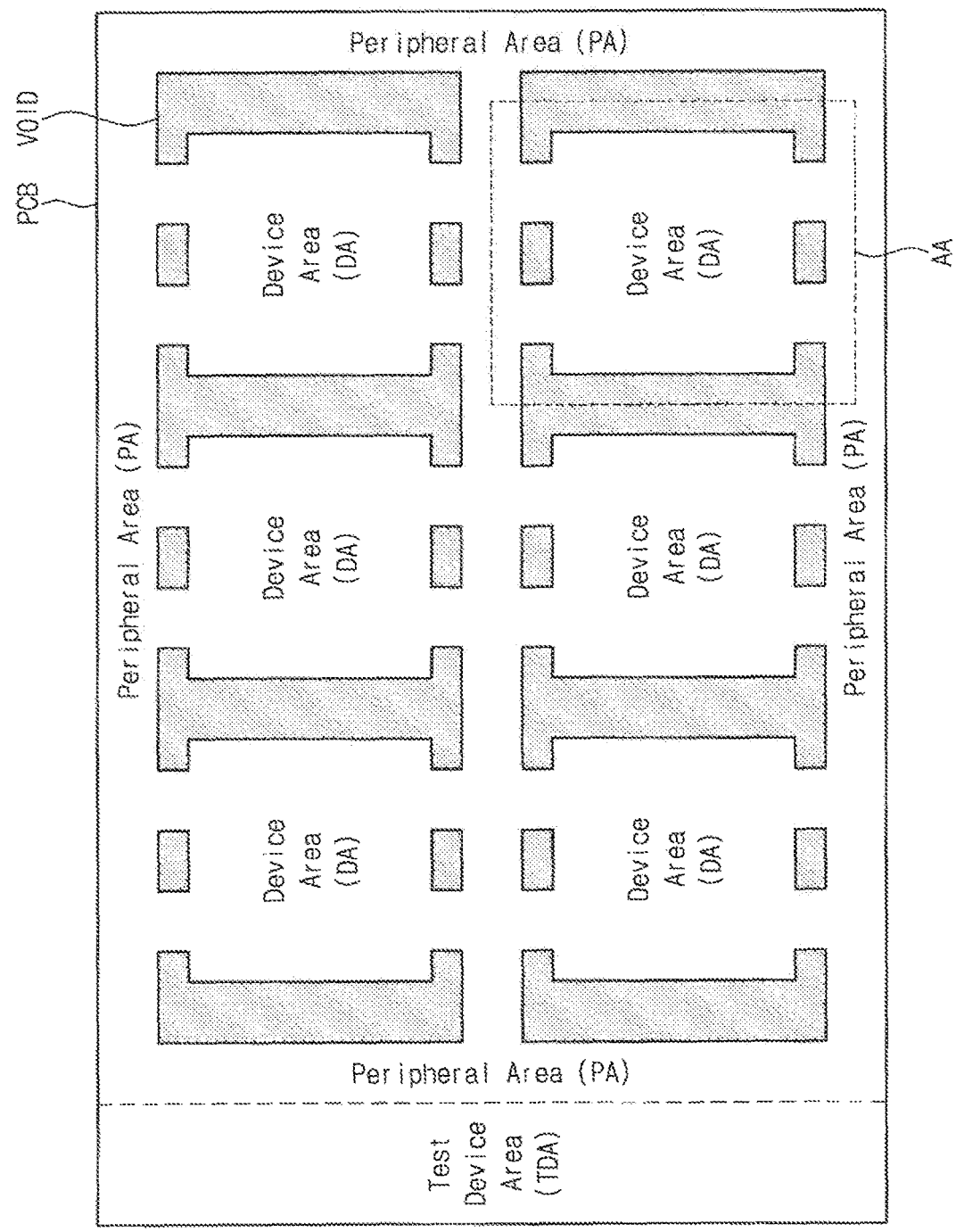
FIG. 1 is a diagram illustrating a printed circuit board according to embodiments of the inventive concepts.

Below, embodiments of the inventive concepts will be described in detail with reference to the attached drawings to the extent that the scope and spirit of the inventive concepts are easily implemented by a person of ordinary skill in the art to which the inventive concepts belong. These inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like reference numerals refer to like elements throughout this application.

It will be understood that, although the terms first, second, etc may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between" "adjacent" versus "directly adjacent," etc.).

The terminology used herein is for the purpose of describing particular embodiments and is not intended to be limiting of the inventive concepts. As used herein, the similar forms "a," "an," and "the" are intended to include the plural forms as well, unless the context clearly indicates otherwise. It will be further understood that the terms "comprises," "comprising," "includes," and/or "including," when used herein, specify the presence of stated features, decimals, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concepts belong. It will be further understood that toms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram illustrating a printed circuit board PCB according to some embodiments of the inventive concepts. Referring to FIG. 1, a primed circuit board PCB may be divided into device areas DA, a peripheral area PA, and a test device area TDA.

The device areas DA may be areas on which a semiconductor package is mounted. Semiconductor packages may be respectively mounted on the device areas DA to implement devices. The device areas DA may be formed on the printed circuit board PCB. That is, the printed circuit board PCB may be a serially arranged printed circuit board (PCB). In FIG. 1, an embodiment of the inventive concepts is exemplified in which six device areas DA are formed on the printed circuit board PCB. However, the number of the device areas DA formed on the printed circuit board PCB may not be limited thereto.

The peripheral area PA may be an area surrounding the device areas DA. The peripheral area PA may function as a support for supporting the device areas DA. Patterns (e.g., wires having a conductor) for testing the semiconductor packages mounted on the device areas DA may be disposed at the peripheral area PA.

Elements which communicate with a test apparatus for testing the devices formed on the device areas DA of the printed circuit board PCB may be arranged at the test device area TDA. For example, a node, a pad, a slot, a terminal, a connector, and/or the like for communication with the test apparatus may be formed in the test device area TDA. The patterns for testing the devices formed on the device areas DA may be extended from the test device areas TDA toward the device areas DA through the peripheral area PA.

Voids VOID may be formed between each device area DA and the peripheral area PA. For example, the voids VOID may include perforations penetrating the printed circuit hoard PCB. The formation of the voids VOID may reduce the time taken to separate the device areas DA from the peripheral area PA, the difficulty in separating the device areas DA from the peripheral area PA, and damage to the semiconductor packages in the separating process.

Figure 2:
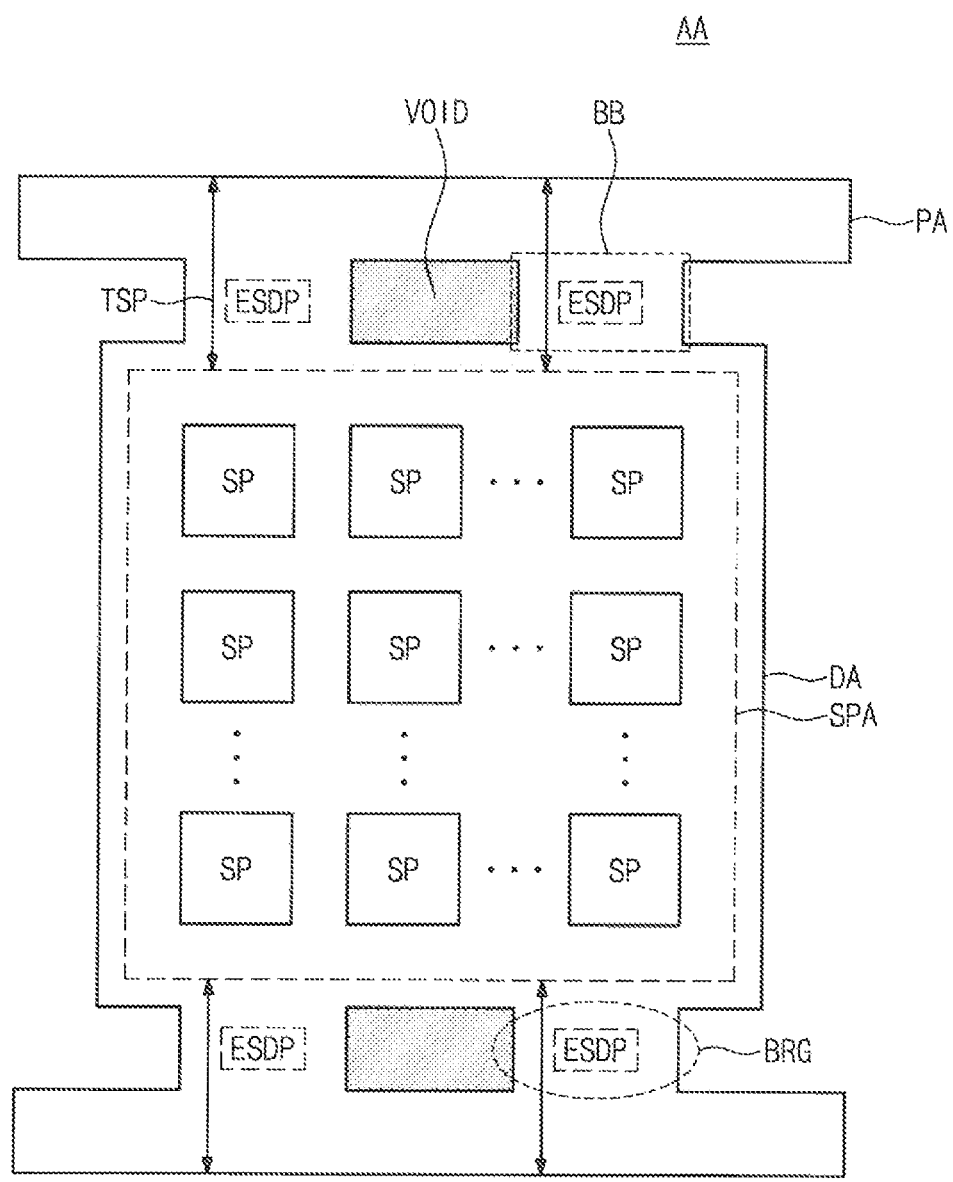
FIG. 2 is a diagram illustrating in more detail a box shown in FIG. 1.

FIG. 2 is a diagram illustrating a box AA shown in FIG. 1. Referring to FIG. 2, a semiconductor package area SPA on which the semiconductor packages are mounted may be formed in the device area DA. A plurality of semiconductor packages SP may be mounted on the semiconductor package area SPA.

The device area DA may be connected to the peripheral area PA through bridge areas BRG. Test signal patterns TSP for testing the semiconductor packages SP may be formed in the bridge areas BRG. The test signal patterns TSP may include wires having a conductor and/or other conductive patterns. Furthermore, an electrostatic discharge pattern ESDP may be formed in the bridge areas BRG. The electrostatic discharge pattern ESDP may discharge static electricity occurring when the bridge areas BRG are cut. The electrostatic discharge pattern ESDP may receive a constant voltage such as a ground voltage or a power supply voltage from the peripheral area PA. For example, the electrostatic discharge pattern ESDP may be connected to a constant voltage source at the peripheral area PA. The electrostatic discharge pattern ESDP may not be connected to any conductive path such as wires, printed wires, package pins, package balls, etc. at the device area DA. The electrostatic discharge pattern ESDP may be electrically floated from the device area DA.

Figure 3:
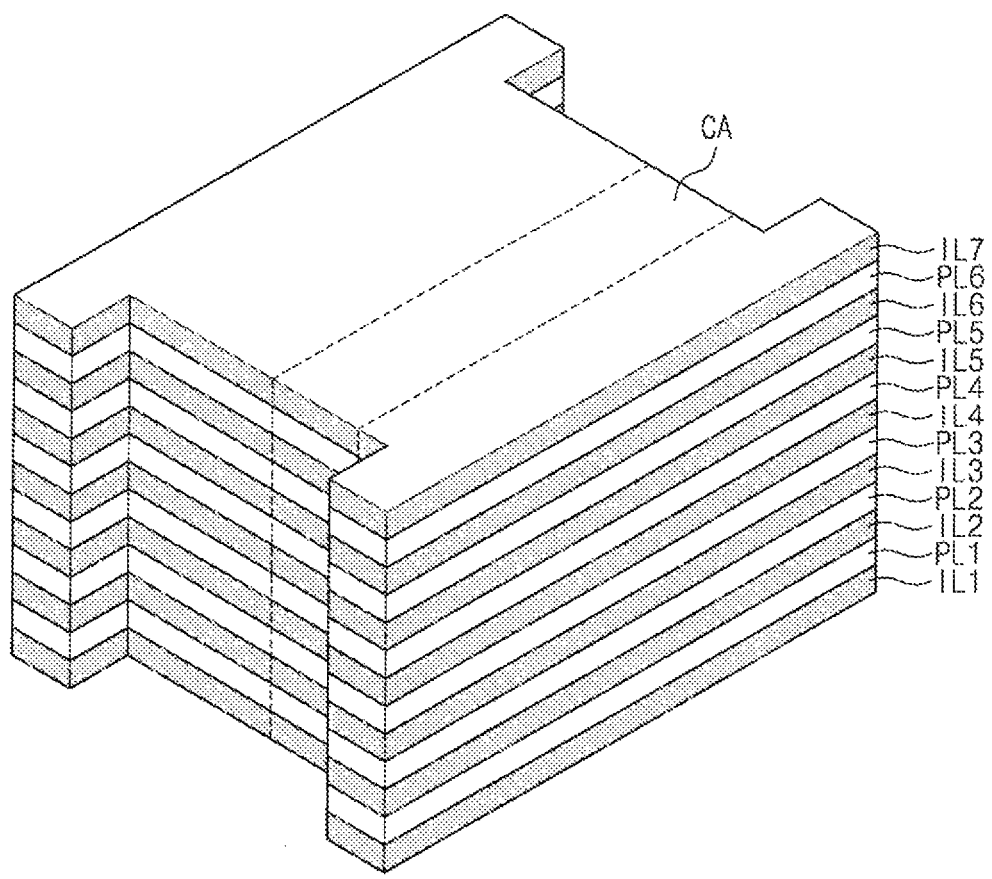
FIG. 3 is a perspective sectional view illustrating a box BB shown in FIG. 2.

FIG. 3 is a perspective sectional view illustrating a box BB shown in FIG. 2. Referring to FIG. 3, a printed circuit board PCB or a bridge area BRG may have a structure where a plurality of insulation layers IL1 to IL7 and a plurality of pattern layers PL1 to PL6 are alternately stacked, in some example embodiments, a top surface and a bottom surface of the printed circuit board PCB or the bridge areas BRG may include the insulation layer IL7 and the insulation layer IL1 respectively. One pattern layer may be provided between the insulation layers which are adjacent thereto. One insulation layer may be provided between the pattern layers which are adjacent thereto.

Each of the insulation layers IL1 to IL7 may include an insulation material, and the insulation layers IL1 to IL7 may electrically separate the pattern layers PL1 to PL6. Each of the pattern layers PL1 to PL6 may include the test signal pattern TSP and/or the electrostatic discharge pattern ESDP.

Six pattern layers PL1 to PL6 and seven pattern layers PL1 to PL7 are illustrated in the example embodiments of FIG. 3. However, the number of layers in the printed circuit board PCB or the bridge area ERG may not be limited thereto.

Referring to FIGS. 1 to 3, after the semiconductor packages SP are mounted on the device areas DA, the device areas DA may be separated from the peripheral area PA by cutting the bridge areas BRG. Thus, devices including the printed circuit board PCB and the semiconductor packages SP about the device areas DA may be manufactured. In FIG. 3, a portion to be cut by an external apparatus (e.g., router) in the bridge area ERG may be shown as a cutting area CA.

When the cutting area CA is cut by the router, bits of the router may collide with the insulation layers IL1 to IL7 and the pattern layers PL1 to PL6. Static electricity may occur when the bits of the router collides with the insulation layers IL1 to IL7 and the pattern layers PL1 to PL6. When the static electricity is transferred to the semiconductor packages SP mounted on the device areas DA, the semiconductor packages SP may be damaged.

A printed circuit board PCB according to some embodiments of the inventive concepts may reduce or prevent static electricity from being transferred to the semiconductor packages SP by forming an electrostatic discharge pattern in at least one of the pattern layers PL1 to PL6. Thus, the reliability and yield of the devices formed based on the printed circuit board PCB may be improved.

Figure 4:
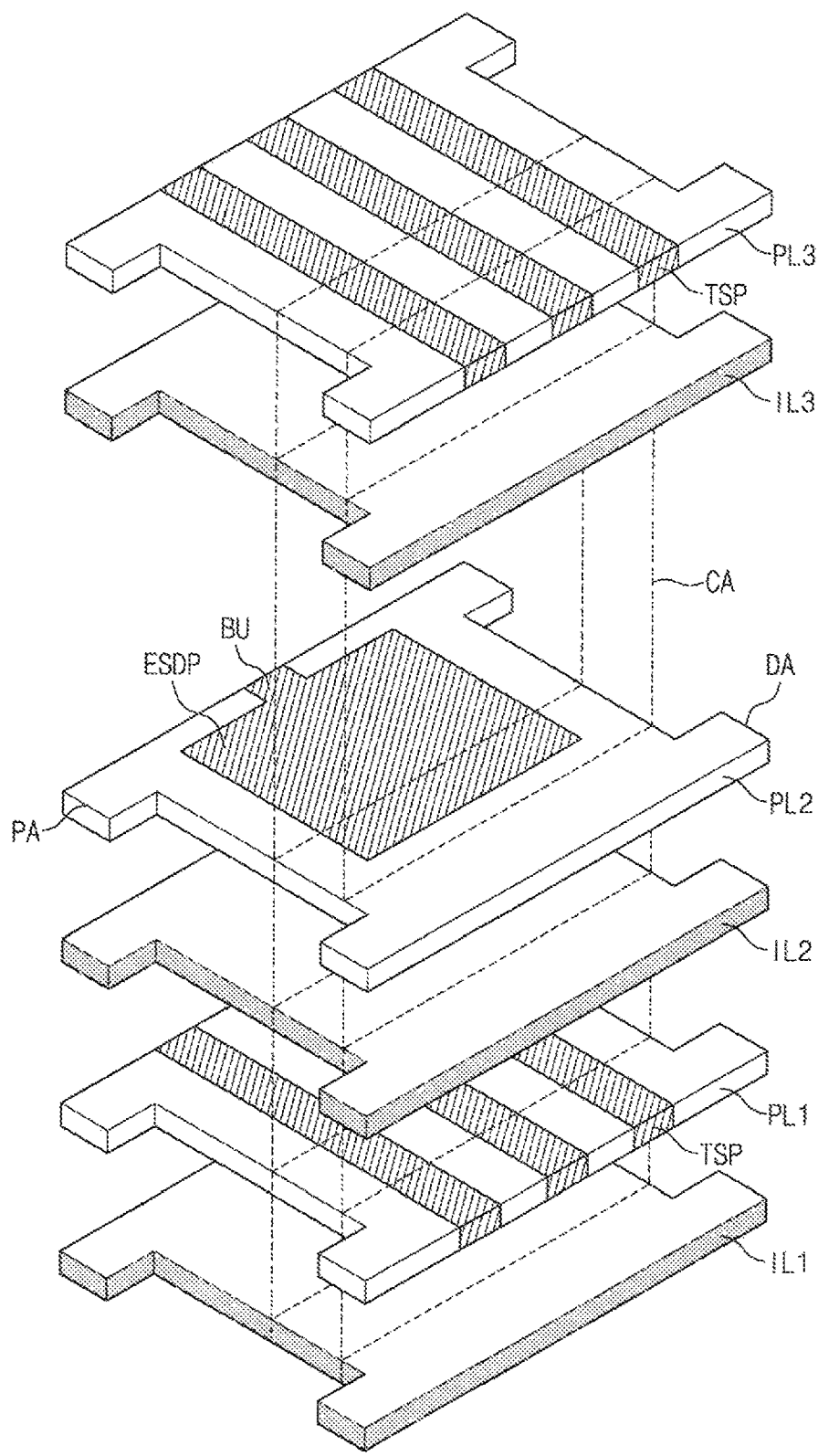
FIG. 4 is an exploded perspective view illustrating a portion of layers in a bridge area shown in FIG. 3.

FIG. 4 is an exploded perspective view illustrating a portion among layers in a bridge area BRG shown in FIG. 3. In some example embodiments, the first to third insulation layers IL1 to IL3 and the first to third pattern layers PL1 to PL3 are illustrated in FIG. 4. Though three insulation layers and three pattern layers are illustrated, the number of layers may not be limited thereto, and may be less than three or more than three.

Retelling to FIG. 4, the first to third insulation layers IL1 to IL3 may include insulation materials. Each of the first to third pattern layers PL1 to PL3 may include insulation materials and conductive patterns formed between insulation materials. In some example embodiments, for concise description, as illustrated in FIG. 4, the conductive patterns are filled with lines, and the insulation materials are not filled with lines.

The first pattern layer PL1 and the third pattern layer PL3 may include the test signal patterns TSP. The test signal patterns TSP may be extended toward the device area DA from the peripheral area PA through the bridge area BRG.

The electrostatic discharge pattern ESDP may be formed in the second pattern layer PL2. The electrostatic discharge pattern ESDP may be extended toward the peripheral area PA through a bridge pattern BU. A constant voltage such as a ground voltage or a power supply voltage may be supplied to the electrostatic discharge pattern ESDP from the peripheral area PA through the bridge pattern BU. The electrostatic discharge pattern ESDP may not be connected to any conductive path such as wires, printed wires, package pins, package balls, etc. of the device area DA. The electrostatic discharge pattern ESDP may be electrically floated from the device area DA.

Static electricity arising from the first to third insulation layers IL1 to IL3 or the first to third pattern layers PL1 to PL3 may be transferred to the electrostatic discharge pattern ESDP by a coupling capacitance and may be discharged by the constant voltage. Thus, the static electricity occurring in cutting the printed circuit board PCB may be reduced or prevented, thereby improving the reliability and yield of the devices.

In some example embodiments, the electrostatic discharge pattern ESDP may be formed in the shape of a spare plane. However, the scope and spirit of the inventive concepts may not be limited thereto. For example, the electrostatic discharge pattern ESDP may be changed in various shapes such as a circular plane, a triangular plane, an elliptic plane, a five angular plane, or the like. For example, the electrostatic discharge pattern ESDP may be formed to increase the coupling capacitance with the test signal patterns TSP. The electrostatic discharge pattern ESDP may be formed to have a shape similar to the test signal patterns TSP. The electrostatic discharge pattern ESDP may be formed to have the largest size within a permitted range. The electrostatic discharge pattern ESDP may be formed to have the largest size within the permitted range in the cutting area CA.

In some example embodiments, the electrostatic discharge pattern ESDP may not extend to the device area DA. If the electrostatic discharge pattern ESDP extends to the device area DA, a portion of the electrostatic discharge pattern ESDP may remain after cutting. The remaining portion may be shorted with the test signal pattern unintentionally due to physical impact during cutting. Thus, to prevent the unintended short of the electrostatic discharge pattern ESDP, the electrostatic discharge pattern ESDP may be formed not to extend to the device area DA.

FIGS. 5 to 11 are diagrams illustrating various embodiments of electrostatic discharge patterns ESDP.

Figure 5:
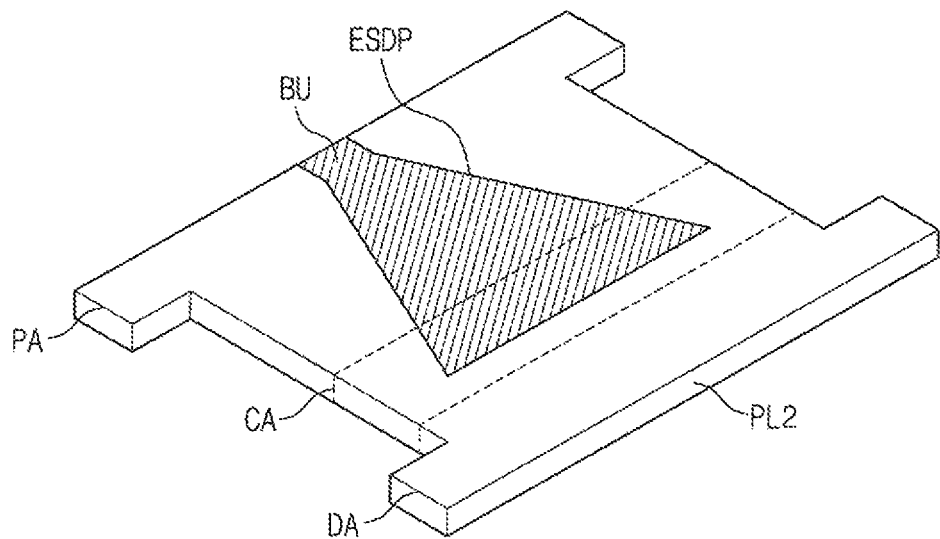
FIGS. 5 to 11 are diagrams illustrating various embodiments of the electrostatic discharge pattern.

Referring to FIG. 5, an electrostatic discharge pattern ESDP may be formed in a pattern layer of the bridge area BRG, such as, for example, the second pattern layer PL2. The electrostatic discharge pattern ESDP may be formed to extend from the peripheral area PA toward the device area DA in the cutting area CA. The electrostatic discharge pattern ESDP may include a portion having a triangular plane shape of which a width increases as the electrostatic discharge pattern ESDP extends closer to the cutting area CA. The electrostatic discharge pattern ESDP may be extended toward the peripheral area PA through a bridge pattern BU and may be connected to a constant voltage source at the peripheral area PA.

Figure 6:
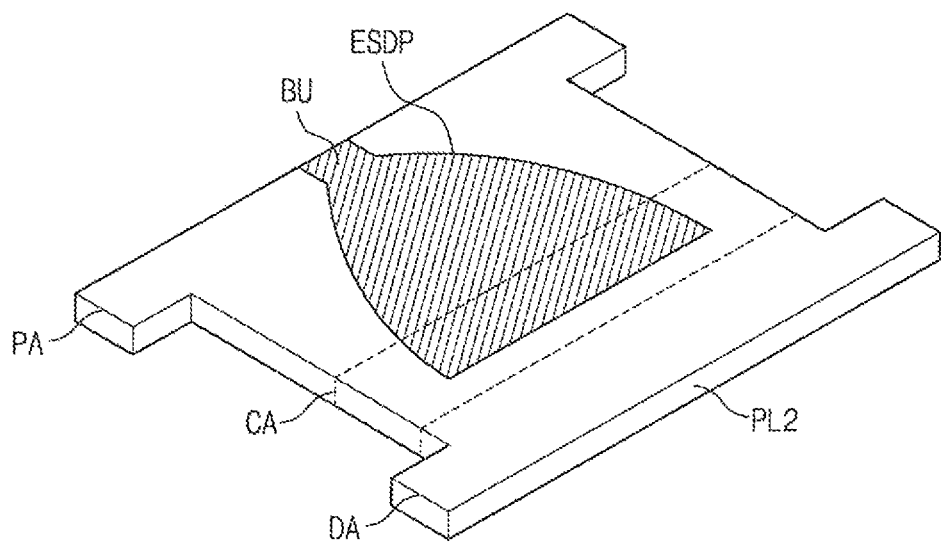

Referring to FIG. 6, the electrostatic discharge pattern ESDP may be formed in a pattern layer of the bridge area BRG, such as, for example, the second pattern layer PL2. The electrostatic discharge pattern ESDP may extend towards the device area DA so as to be formed from the peripheral area PA up to the cutting area CA. The electrostatic discharge pattern ESDP may include a portion having a semicircular plane shape of which a width increases as the electrostatic discharge pattern ESDP extends closer to the cutting area CA. The electrostatic discharge pattern ESDP may be extended toward the peripheral area PA through the bridge pattern BU so as to be connected to the constant voltage source at the peripheral area PA.

Figure 7:
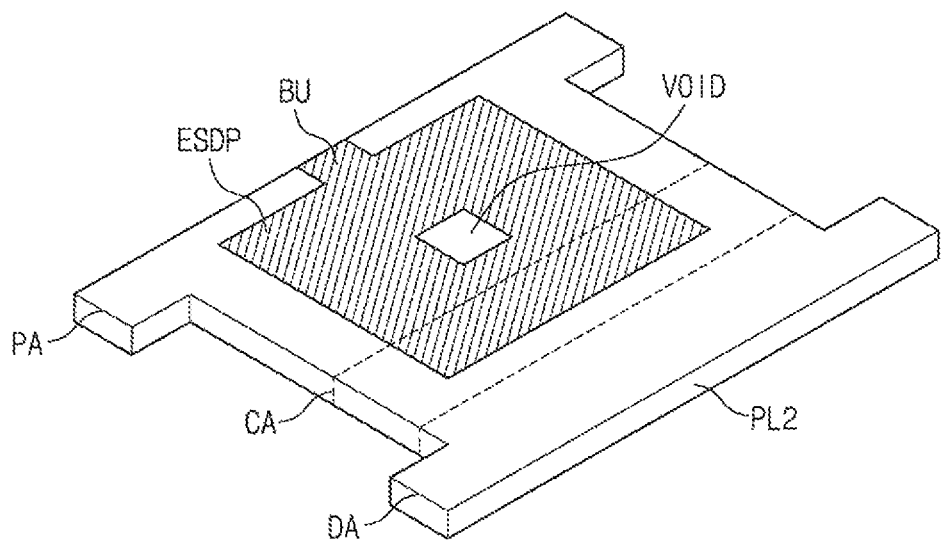

Referring to FIG. 7, the electrostatic discharge pattern ESDP may be formed in a pattern layer of be bridge area BRG, such as, for example, the second pattern layer PL2. The electrostatic discharge pattern ESDP may include a portion formed in the shape of a square plane as described with reference to FIG. 4. In some embodiments a void VOID may be formed in the electrostatic discharge pattern ESDP shown in FIG. 7. The void VOID may be formed of an insulation material. The electrostatic discharge pattern ESDP may extend towards the peripheral area PA through the bridge pattern BU so as to be connected to the constant voltage source at the peripheral area PA.

As described with reference to FIGS. 3 to 7, the electrostatic discharge pattern ESDP may be formed in various plane shapes. Similarly, the void VOID in the electrostatic discharge pattern ESDP may also be formed in various shapes. Furthermore, the number of voids formed in the electrostatic discharge pattern ESDP may be more than one. For example, two or more voids may be formed in the electrostatic discharge pattern ESDP.

For example, a plane shape of the electrostatic discharge pattern ESDP and/or a void shape may be determined to increase a coupling capacitance between the electrostatic discharge pattern ESDP and the test signal patterns TSP (refer to FIG. 2).

Figure 8:
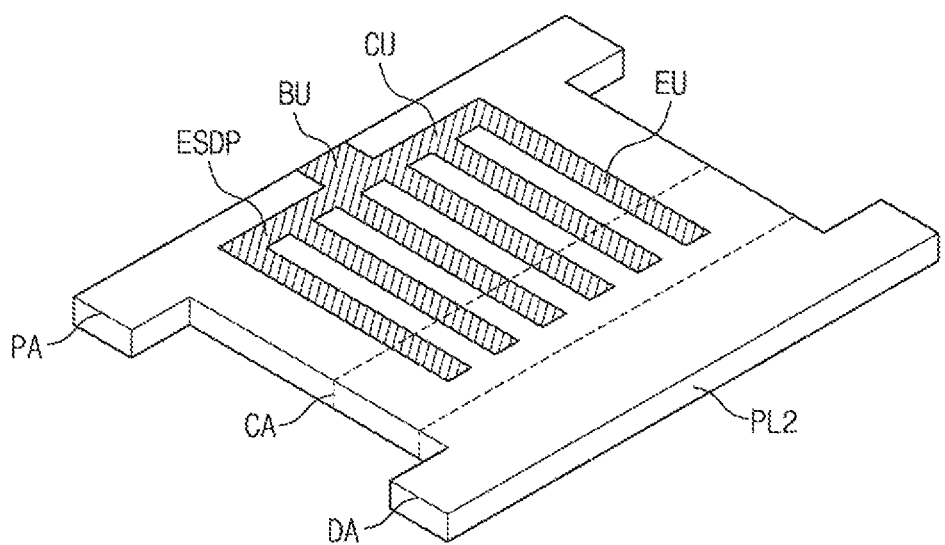

Referring to FIG. 8, the electrostatic discharge pattern ESDP may be formed in a pattern layer of the bridge area BRG, such as, for example, the second pattern layer PL2. The electrostatic discharge pattern ESDP may be formed in the shape of a square plane as described with reference to FIG. 4. The electrostatic discharge pattern ESDP may include extensions EU and a crossing portion CU. The extensions EU may include a plurality of patterns extended in parallel from the peripheral area PA toward the device area DA. The crossing portion CU may include a pattern extended in a direction perpendicular to the extensions EU. In some example embodiments, the crossing portion CU may be connected to one end of respective ones of the patterns of the extensions EU. For example, the electrostatic discharge pattern ESDP may be formed to include a portion in a shape of a comb which is extended from the peripheral area PA toward the device area DA.

The crossing portion CU may be connected to a bridge pattern BU. The electrostatic discharge pattern ESDP may be extended toward the peripheral area PA through the bridge pattern BU so as to be connected to the constant voltage source at the peripheral area PA.

Figure 9:
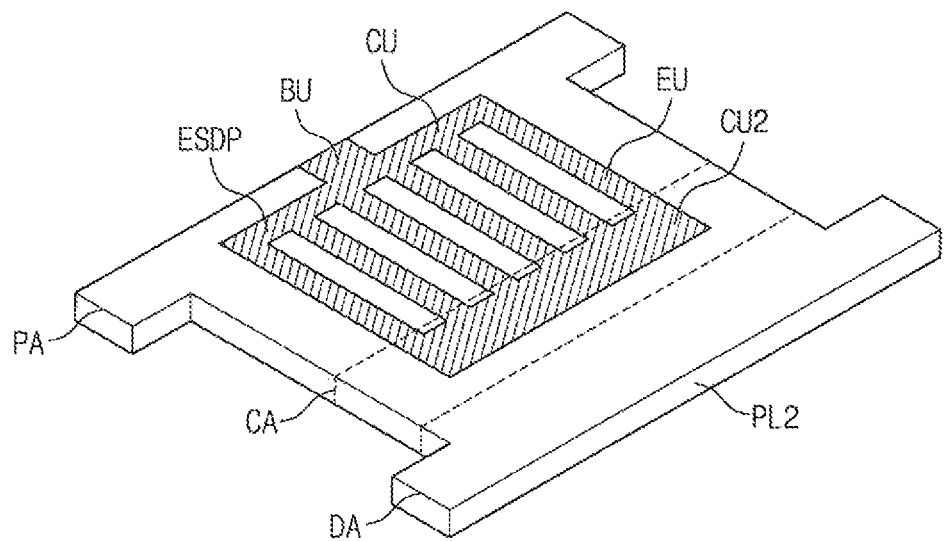

Referring to FIG. 9, the electrostatic discharge pattern ESDP may have a similar shape as described with reference to FIG. 8. Compared with the electrostatic discharge pattern ESDP shown in FIG. 8, the electrostatic discharge pattern ESDP shown in FIG. 9 may further include a second crossing portion CU2 connected to another end of respective ones of the patterns of the extension portion EU. For example, the second crossing portion CU2 may be formed in the cutting area CA. A width of the second crossing portion CU2 may be the same as or larger than that of the crossing portion CU.

Figure 10:
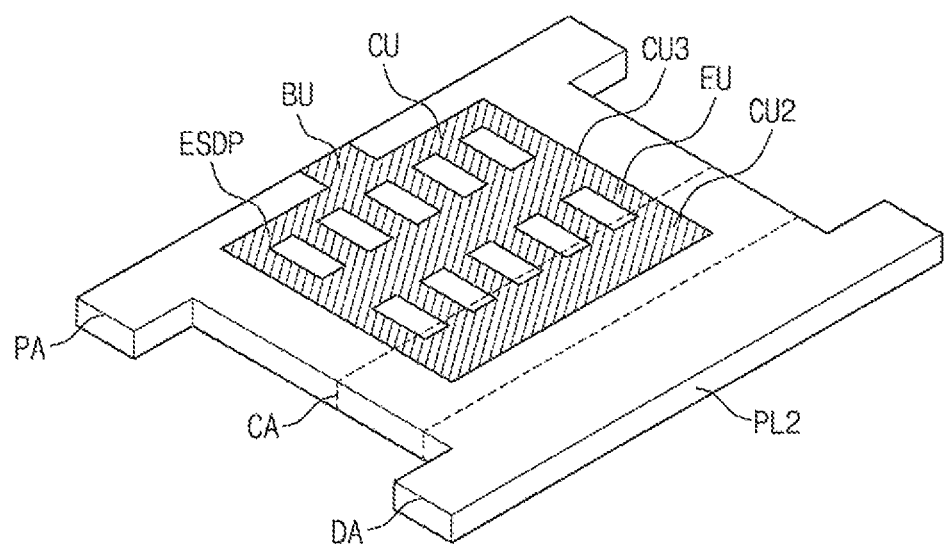

Referring to FIG. 10, the electrostatic discharge pattern ESDP may have a similar shape as described with reference to FIG. 9. Compared with the electrostatic discharge pattern ESDP shown in FIG. 9, the electrostatic discharge pattern ESDP shown in FIG. 10 may further include a third crossing portion CU3 connected to a middle portion of respective ones of the patterns of the extensions EU. For example, the electrostatic discharge pattern ESDP may include a portion having a mesh structure.

Figure 11:
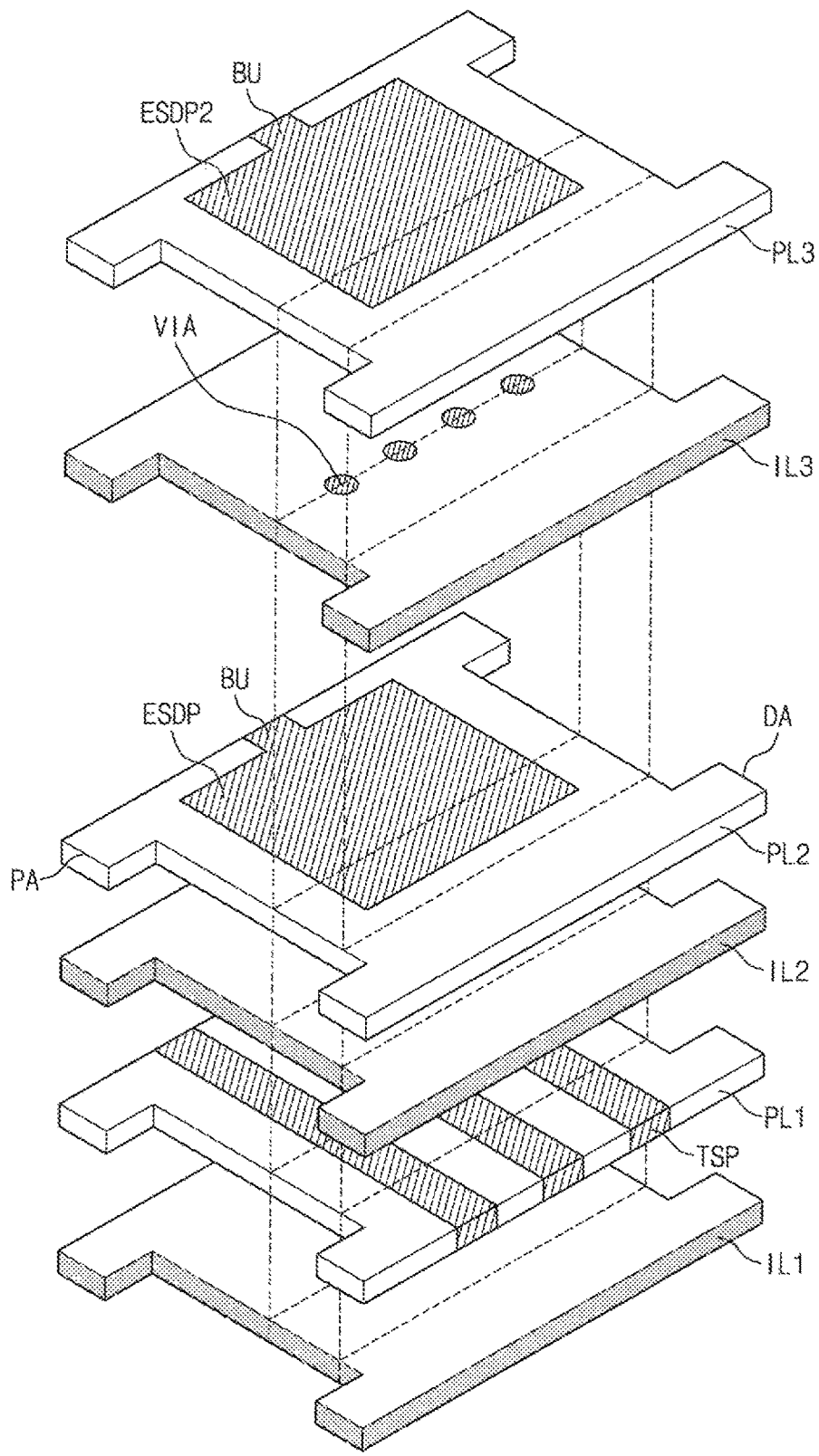

Referring to FIG. 11, a second electrostatic discharge pattern ESDP2 may be additionally formed in a pattern layer of the bridge area BRG, such as, for example, the third pattern layer PL3, in addition to the electrostatic discharge pattern ESDP formed in the second pattern layer PL2. When the electrostatic discharge patterns ESDP and ESDP2 are formed in the pattern layers PL2 and PL3 adjacent each other, the electrostatic discharge patterns ESDP and ESDP2 may be connected to each other through vias VIA penetrating the insulation layer IL3 between the pattern layers PL2 and PL3. The vias VIA may include conductive materials and may electrically connect the electrostatic discharge patterns ESDP and ESDP2. When the electrostatic discharge patterns ESDP and ESDP2 are formed in different pattern layers, the electrostatic discharge patterns ESDP and ESDP2 may improve the performance of discharging static electricity. Furthermore, when the electrostatic discharge patterns ESDP and ESDP2 are connected to each other through the vias VIA, the performance of discharging static electricity may be further improved through the connected electrostatic discharge patterns ESDP and ESDP2.

As described above, the printed circuit board PCB according to example embodiments of the inventive concepts may include an electrostatic discharge pattern ESDP disposed to be adjacent the cutting area CA. Accordingly, the static electricity occurring due to cutting the cutting areas CA may be discharged through the electrostatic discharge pattern ESDP, and thus the reliability and yield of the devices may be improved.

Figure 12:
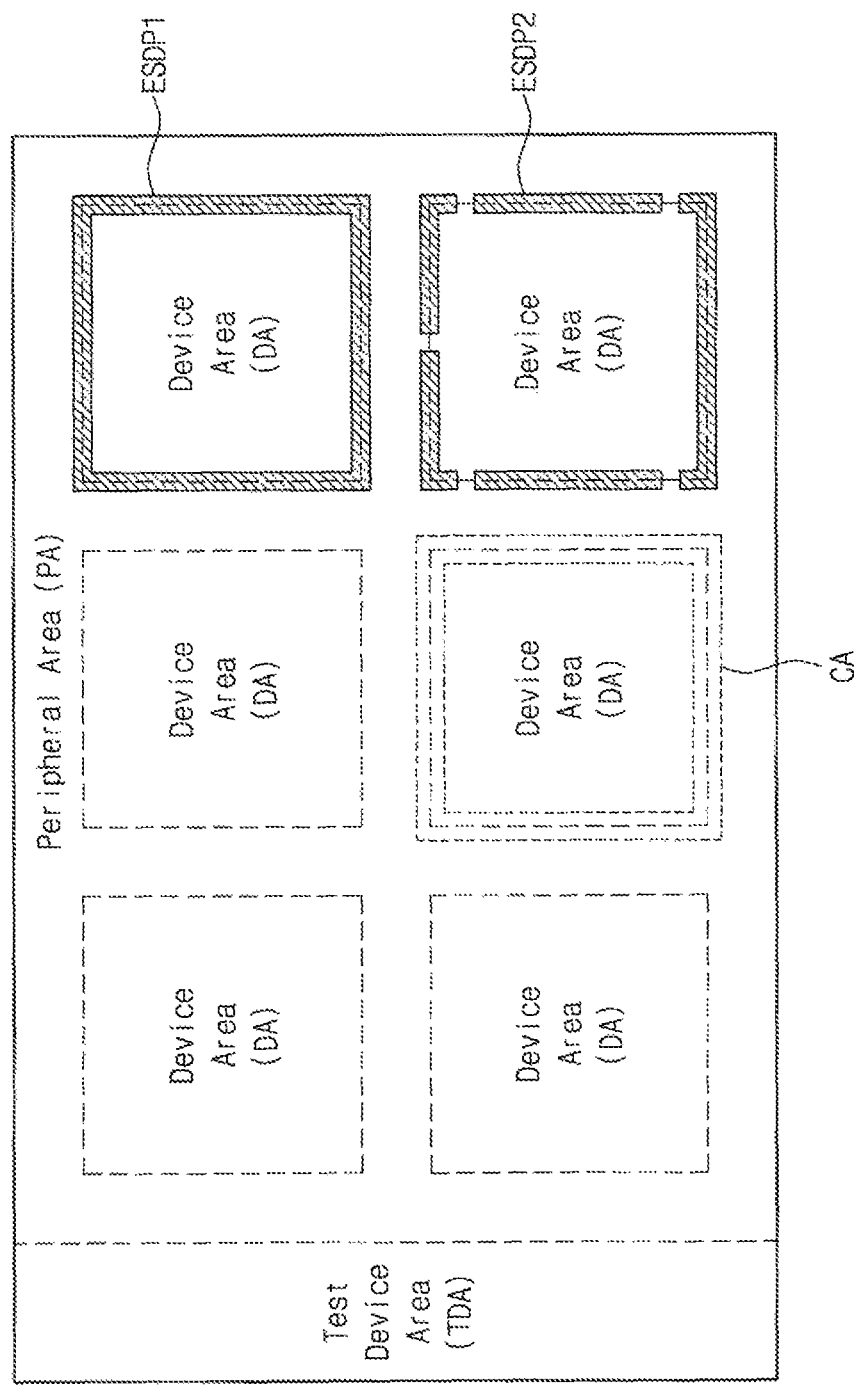
FIG. 12 is a diagram illustrating a printed circuit board according to some embodiments of the inventive concepts.

FIG. 12 is a diagram illustrating a printed circuit board PCB according to some embodiments of the inventive concepts. Referring to FIG. 12, a printed circuit board PCB may be divided into device areas DA, a peripheral area PA, and a test device area TDA.

Compared with the minted circuit board PCB shown in FIG. 1, the voids VOID may be absent between the device areas DA and the peripheral area PA of the printed circuit board PCB shown in FIG. 12. Cutting areas CA may be formed between the device areas DA and the peripheral area PA as illustrated in FIG. 12 (or at (or around) respective boundary regions therebetween). Although only one cutting area CA is shown in FIG. 12 for ease of description, additional cutting areas CA may exist for respective device areas DA. The electrostatic discharge pattern ESDP1 and/or ESDP2 may be formed at a place adjacent the cutting areas. That is, the electrostatic discharge pattern ESDP1 and/or ESDP2 may be formed to surround each of the device areas. A plurality of portions of the electrostatic discharge pattern ESDP1 and/or ESDP2 may be formed to continuously surround the boundary region of each of the device areas DA (such as ESDP1) or to be discontinuously or discretely arranged along the boundary region of each of the device areas DA (such as ESDP2). Although only one ESDP1 and only one ESDP2 is shown in FIG. 12 for ease of (description, one of the ESDP1 or ESDP2 may be provided to respective device areas DA.

For example, one or more of the electrostatic discharge patterns as described with reference to FIGS. 4 to 11 or a combination of two or more thereof may be formed to surround the device areas.

Figure 13:
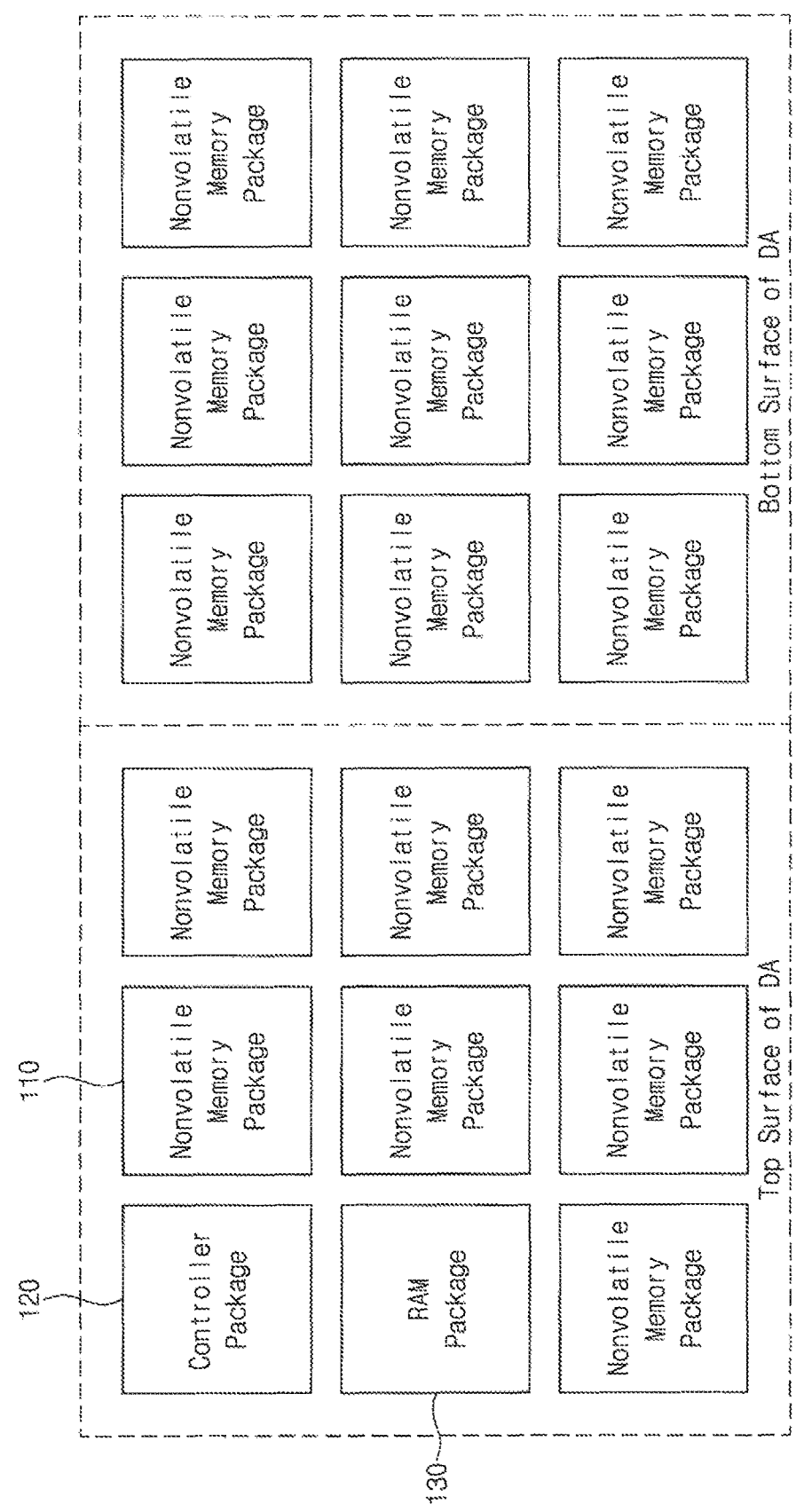
FIG. 13 is a diagram illustrating an example embodiment of a storage device in which semiconductor packages may be mounted on a top surface and a bottom surface of the device areas.

FIG. 13 is a diagram illustrating an example embodiment of a storage device 100 in which semiconductor packages are mounted on a top surface and a bottom surface of the device areas DA. Referring to FIG. 13, a plurality of nonvolatile memory packages 110 may be mounted on the top surface and the bottom surface of the device areas DA. A controller package 120 and a RAM package 130 may be formed on the top surface of the device areas DA.

The nonvolatile memory packages 110 may perform writing, reading and erasing under control of the controller package 120. The nonvolatile memory packages 110 may receive a command and an address from the controller package 120 through an input/output channel. The nonvolatile memory packages 110 may exchange data with the controller package 120 through the input/output channel.

The nonvolatile memory packages 110 may exchange a control signal with the controller package 120 through a control channel. For example, each of the nonvolatile memory packages 110 may receive, from the controller package 120, at least one of a chip enable signal (/CE) for selecting at least one of a plurality of nonvolatile memory chips in the nonvolatile memory packages 110, a command latch enable signal (CLE) indicating that a signal received from the controller package 120 through the input/output channel is a command, an address latch enable signal (ALE) indicating that a signal received from the controller package 120 through the input/output channel is an address, a read enable signal (/RE) generated by the controller package 120 at a read operation, periodically toggled, and used to tune timing, a write enable signal (/WE) activated by the controller package 120 when the command or the address is transmitted, a write protection signal (/WP) activated by the controller package 120 to prevent unintended writing or erasing when a power changes, and a data strobe signal (DQS) used to adjust input synchronization about the data transmitted through the input/output channel and generated from the controller package 120 at a write operation so as to be periodically toggled. For example, each of the nonvolatile memory packages 110 may output, to the controller package 120, a ready/busy signal (R/nB) indicating whether the nonvolatile memory packages 110 is performing a program, erase or read operation and a data strobe signal (DQS) used to adjust output synchronization about the data and generated from the read enable signal (/RE) by the nonvolatile memory packages 110 so as to be periodically toggled.

The nonvolatile memory packages 110 may include a flash memory. However, the scope and spirit of the inventive concepts may not be limited thereto. For example, the nonvolatile memory packages 110 may incorporate various types of nonvolatile memory devices, such as a phase-change RAM (PRAM), a magnetic RAM (MRAM), a resistive RAM (RRAM), a ferroelectric RAM (FeRAM), and the like.

The controller package 120 may control the nonvolatile memory packages 110. For example, the controller package 120 may control the nonvolatile memory packages 110 through an input/output channel and a control channel so as to perform a write, read or erase operation.

The controller package 120 may control the nonvolatile memory packages 110 in response to control of an external host device (not illustrated). For example, the controller package 120 may communicate with the external host device based on a format different from the format for communications with the nonvolatile memory packages 110. A unit of data which the controller package 120 communicates with the nonvolatile memory packages 110 may be different from a unit of data which the controller package 120 communicates with the external host device.

The controller package 120 may use the RAM package 130 as a buffer memory, or a cache memory, and/or a working memory. The controller package 120 may store data or codes needed to manage the nonvolatile memory packages 110 at the RAM package 130. For example, the controller package 120 may read data or codes needed to manage the nonvolatile memory packages 110 from the nonvolatile memory packages 110 and may load the read data or codes on the RAM package 130 for controlling the nonvolatile memory packages 110.

The RAM package 130 may include at least one of a variety of random access memories, such as a dynamic RAM (DRAM), a static RAM (SRAM), a synchronous DRAM (SDRAM), a PRAM, a MRAM, a RRAM, a FRAM, and the like.

In some example embodiments, the controller package 120 and nonvolatile memory chips included with the nonvolatile memory packages 110 may be connected to each other based on a channel and a way. One channel may include one data channel and one control channel. One data channel may include eight data lines. One control channel may include control lines for transferring the chip enable signal (/CE), the command Latch enable signal (CLE), the address latch enable signal (ALE), the read enable signal (/RE), the write enable signal (/WE), the write protect signal (/WP), and the ready/busy signal (R/nB).

Nonvolatile memory packages connected to one channel or nonvolatile memory chips may constitute a way. When being connected to one channel, a nonvolatile memory packages or the nonvolatile memory chips may compose an n-way. The nonvolatile memory packages or the nonvolatile memory chips belonging to one way may share data lines and the control lines for transferring the command latch enable signal (CLE), the address latch enable signal (ALE), the read enable signal (/RE), the write enable signal (/WE), and the write protect signal (/WP). Each of the nonvolatile memory packages and the nonvolatile memory chips belonging to one way may communicate with the controller package 120 through dedicated control lines for the chip enable signal (/CE) and the ready/busy signal (R/nB).

The controller package 120 may alternately access the n-way nonvolatile memory packages connected to one channel or the nonvolatile memory chips. The controller package 120 may independently access the nonvolatile memory packages connected with different channels or the nonvolatile memory chips. The controller package 120 may alternately or simultaneously access the nonvolatile memory chips connected with different channels or the nonvolatile memory chips.

In some example embodiments, the nonvolatile memory packages or the nonvolatile memory chips may be connected with the controller package 120 in the form of a wide input/output (IO). For example, the nonvolatile memory packages or the nonvolatile memory chips connected to different channels may share a control line for a chip enable signal (/CE). The nonvolatile memory packages or the nonvolatile memory chips which share the control line for the chip enable signal (/CE) may be accessed at the same time. Data lines of different channels may be used at the same time, and thus, a wide input/output bandwidth may be achieved.

In some example embodiments, the controller package 120 and the RAM package 130 may be combined in a package-on-package (POP) or chip-on-chip (COC) form.

The storage device 100 may be a solid state drive (SSD).

In some example embodiments, semiconductor packages mounted on the device area DA may compose the storage device 100. However, the scope and spirit of the inventive concepts may not be limited thereto. For example, the semiconductor packages mounted on the device area DA may compose a variety of electronic devices such as, for example, a smart phone, a smart pad, a digital camera, and the like.

Figure 14:
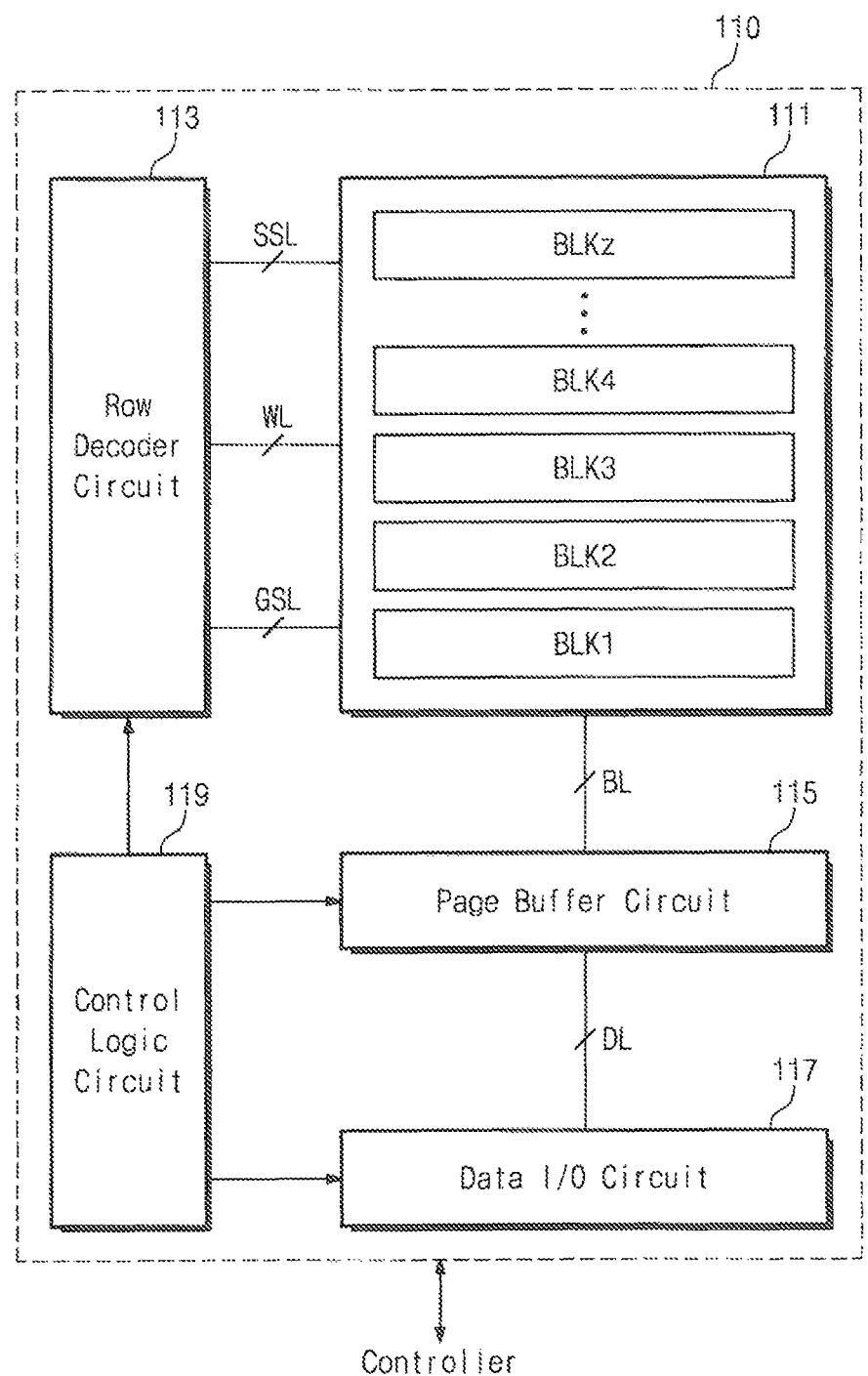
FIG. 14 is a block diagram illustrating a nonvolatile memory package according to embodiments of the inventive concepts.

FIG. 14 is a block diagram illustrating a nonvolatile memory package 110 according to some embodiments of the inventive concepts. Referring to FIGS. 13 and 14, the nonvolatile memory package 110 may include a memory cell array 111, a row decoder circuit 113, a page buffer circuit 115, a data input/output circuit 117, and a control logic circuit 119.

The memory cell array 111 may include a plurality of memory blocks BLK1 to BLKz. Each memory block may include a plurality of memory cells. Each memory block may be connected to the row decoder circuit 113 through at least one string selection line SSL, a plurality of word lines WL, and at least one ground selection line GSL. Each memory block may be connected to the page buffer circuit 115 through a plurality of bit lines BL. The memory blocks BLK1 to BLKz may be connected in common to the plurality of bit lines BL. Memory cells in the memory blocks BLK1 to BLKz may have the same or similar structures.

In some example embodiments, each of the memory blocks BLK1 to BLKz may be a unit of an erase operation. An erase operation of memory cells in the memory cell array 111 may be carried out by a memory block. The memory cells in a memory block may be erased at the same time. In other example embodiments, each memory block may be divided into a plurality of sub-blocks. Erasing may be made by each of the sub-blocks.

In some example embodiments, each of the memory blocks BLK1 to BLKz may include a physical storage space which is distinguished by a block address. Each of the word lines WL may correspond to a physical storage space which is distinguished by a row address. Each of the bit lines BL may correspond to a physical storage space which is distinguished by a column address.

The row decoder circuit 113 may be connected to the memory cell array 111 through a plurality of ground selection lines GSL, the plurality of word lines WL, and a plurality of string selection lines SSL. The row decoder circuit 113 may operate in response to control of the control logic circuit 119. The row decoder circuit 113 may decode an address received from a controller 120 through an input/output channel and may control voltages to be applied to the string selection lines SSL, the word lines WL, and the ground selection lines GSL based on the decoded address.

For example, at programming, the row decoder circuit 113 may apply a program voltage (VGPM) to a selected word line in a memory block selected by an address. The row decoder circuit 113 may also apply a pass voltage (VPASS) to unselected word lines in the selected memory block. At reading, the row decoder circuit 113 may apply a selection read voltage (VRD) to the selected word line M the selected memory block. The row decoder circuit 113 may also apply a non-selection read voltage (VREAD) to unselected word lines in the selected memory block selected by the address. At erasing, the row decoder circuit 113 may apply an erase voltage (e.g., a ground voltage or a low voltage of which the level is similar to that of the ground voltage) to word lines in the selected memory block selected by the address.

The page buffer circuit 115 may be connected to the memory cell array 111 through the bit lines BL. The page buffer circuit 115 may be connected to the data input/output circuit 117 through a plurality of data lines DL. The page buffer circuit 115 may operate in response to control of the control logic circuit 119.

During programming, the page buffer circuit 115 may Store data to be programmed in memory cells. The page buffer circuit 115 may apply voltages to the bit lines BL based on the stored data. For example, the page buffer circuit 115 may function as a write driver at a program operation. During reading, the page buffer circuit 115 may sense voltages on the bit lines BL and may store the sensed results. For example, the page buffer circuit 115 may function as a sense amplifier at a read operation.

The data input/output circuit 117 may be connected to the page buffer circuit 115 through the data lines DL. The data input/output circuit 117 may output data, which is read by the page buffer circuit 115, to the controller 120 through the input/output channel and may transfer data, which is received from the controller 120 through the input/output channel, to the page buffer circuit 115.

The control logic circuit 119 may receive a command from the controller 120 through the input/output channel and may receive a control signal therefrom through a control channel. The control logic circuit 119 may receive a command, which is received through the input/output channel, in response to the control signal, may route an address, which is received through the input/output channel, to the row decoder circuit 113, and may route data, which is received through the input/output channel, to the data input/output circuit 117. The control logic circuit 119 may decode the received command and may control the nonvolatile memory package 110 based on the decoded command.

In some example embodiments, the control logic circuit 119 may generate a data strobe signal DQS based on a read enable signal /RE received from the controller package 120 through the input/output channel. The data strobe signal DQS thus generated may be output to the controller package 120 through die control channel. At writing, the control logic circuit 119 may receive the data strobe signal DQS from the controller 120 through the control channel.

Figure 15:
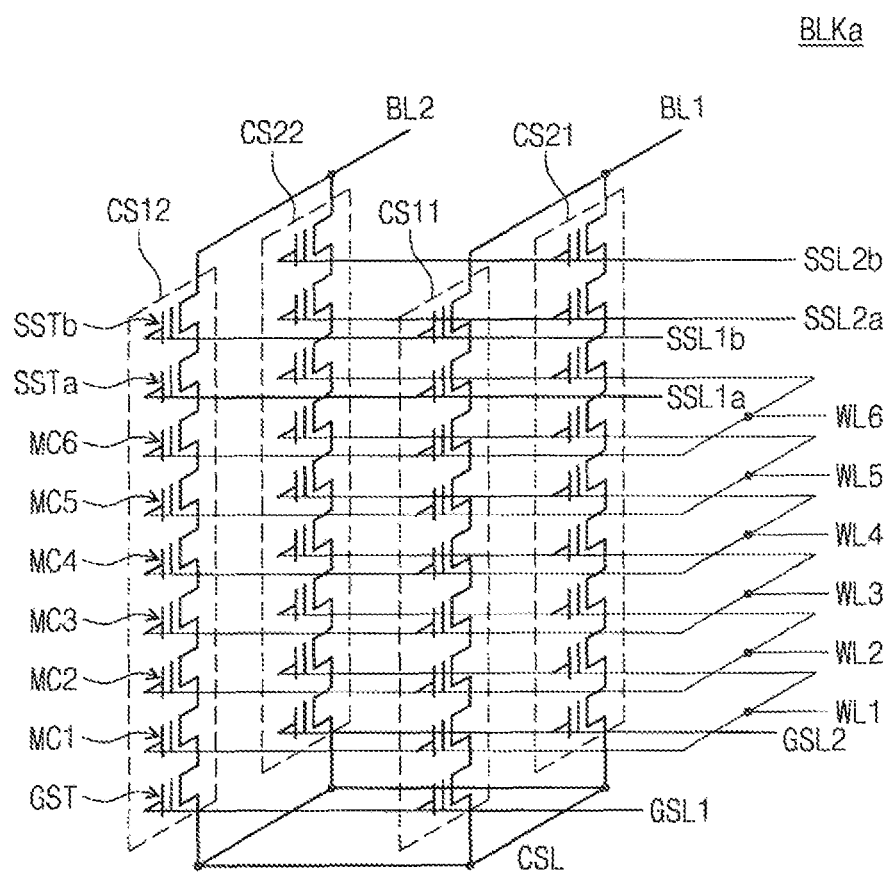
FIG. 15 is a circuit diagram schematically illustrating a memory block according to example embodiments of the inventive concepts.
Figure 15:
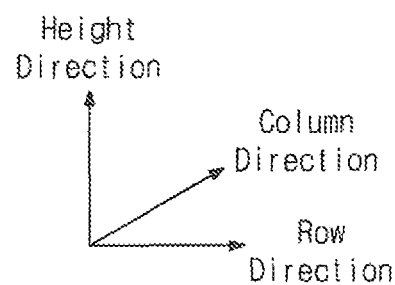

FIG. 15 is a circuit diagram schematically illustrating a memory block BLKa according to example embodiments of the inventive concepts. Referring to FIG. 15, a memory block BLKa may include a plurality of cell strings CS11 to CS21 and CS12 to CS22. The plurality of cell strings CS11 to CS21 and CS12 to CS22 may be arranged in a matrix of rows and columns based on a row direction and a column direction.

For example, the cell strings CS11 and CS12 arranged along the row direction may constitute a first row, and the cell strings CS21 and CS22 arranged along the row direction may constitute a second row. The cell strings CS11 and CS21 arranged along the column direction may constitute a first column, and the cell strings CS12 and CS22 arranged along the column direction may constitute a second column.

Each cell string may contain a plurality of cell transistors. The cell transistors may include ground selection transistors GST, memory cells MC1 to MC6, and string selection transistors SSTa and SSTb. The ground selection transistors GST, memory cells MC1 to MC6, and string selection transistors SSTa and SSTb in each cell string may be stacked in a height direction perpendicular to a plane (e.g., a plane on a substrate of the memory block BLKa) on which the cell strings CS11 to CS21 and CS12 to CS22 are arranged along the rows and the columns.

A plurality of cell transistors may be charge trap type cell transistors of which the threshold voltage changes according to the amount of charges trapped in an insulating layer thereof.

Sources of lowermost ground selection transistors GST may be connected in common to a common source line CSL. Control gates of ground selection transistors GST of the cell strings CS11 to CS21 and CS12 to CS22 may be connected to ground selection lines GSL1 and GSL2, respectively. In some example embodiments, ground selection transistors GST in the same row may be connected to the same ground selection line, and ground selection transistors GST of different TOWS may be connected to different ground selection lines. For example, the ground selection transistors GST of the cell strings CS11 and CS12 in the first row may be connected to the first ground selection line GSL1, and the ground selection transistors GST of the cell strings CS21 and CS22 in the second row may be connected to the second ground selection line GSL2.

Connected in common to a word line are control gates of memory cells that are placed at the same height (or, order) from the substrate (or, the ground selection transistors GST). Connected to different word lines WL1 to WL6 are control gates of memory cells that are placed at different heights (or, orders). For example, memory cells MC1 may be connected in common to a word line WL1. Memory cells MC2 may be connected in common to a word line WL2. Memory cells MC3 may be connected in common to a word line WL3. Memory cells MC4 may be connected in common to a word line WL4. Memory cells MC5 may be connected in common to a word line WL5. Memory cells MC6 may be connected in common to a word line WL6.

In first string selection transistors SSTa, having the same height (or, order), of the cell strings CS11 to CS21 and CS12 to CS22, control gates of the first string selection transistors SSTa in different rows may be connected to different string selection lines SSL1a and SSL2a, respectively. For example, the first sting selection transistors SSTa of the cell strings CS11 and CS12 may be connected in common to a string selection lines SSL1a. The first string selection transistors SSTa of the cell strings CS21 and CS22 may be connected in common to a string selection lines SSL2a.

In second string selection transistors SSTb, having the same height (or, order), of the cell strings CS11 to CS21 and CS12 to CS22, control gates of the second string selection transistors SSTb in different rows may be connected to the different string selection lines SSL1a and SSL2a. For example, the second string selection transistors SSTb of the cell strings CS11 and CS12 may be connected in common to a string selection lines SSL1b. The second string selection transistors SSTb of the cell strings CS21 and CS22 may be connected in common to a string selection lines SSL2b.

That is, cell strings in different rows may be connected to different string selection lines. String selection transistors, having the same height (or, order), of cell strings in the same row may be connected to the same string selection line. String selection transistors, having different heights (or, orders), of cell strings in the same row may be connected to different string selection lines.

In some example embodiments, string selection transistors of cell strings in the same row may be connected in common to a string selection line. For example, the first string selection transistors SSTa of the cell stings CS11 and CS12 may be connected in common to one string selection line SSL1a. For example, string selection transistors SSTa and SSTb of the cell strings CS21 and CS22 in the second row may be connected in common to one string selection line.

Columns of the cell strings CS11 to CS21 and CS12 to CS22 may be connected to different bit lines BL1 and BL2, respectively. For example, string selection transistors SSTb of the cell strings CS11 to CS21 in the first column may be connected in common to a bit line BL1. String selection transistors SST of the cell strings CS12 to CS22 in the first column may be connected in common to a bit line BL2.

Cell strings CS11 and C12 may compose a first plane. Cell strings CS21 and C22 may compose a second plane.

In the memory block BLKa, memory cells of each plane placed at the same height may compose a physical page. A physical page may be a unit of writing and reading the memory cells MC1 to MC6. For example, one plane of the memory block BLKa may be selected by the string selection lines SSL1a, SSL1b, SSL2a, and SSL2b. The cell Strings CS11 and CS12 in a first plane may be connected to the bit lines BL1 and BL2 when a turn-on voltage is supplied to the string selection lines SSL1a and SSL1b and a turn-off voltage is supplied to the string selection lines SSL2a and SSL2b. That is, the first plane may be selected. The cell strings CS21 and CS22 in a second plane may be connected to the bit lines BL1 and BL2 when the turn-on voltage is supplied to the string, selection lines SSL2a and SSL2b and the turn-off voltage is supplied to the string selection lines SSL1a and SSL1b. That is, the second plane may be selected. In a selected plane, a row of memory cells MC may be selected by the word lines WL1 to WL6. In the selected row, a selection voltage may be applied to the second word line WL2, and a non-selection voltage may be applied to the remaining word lines WL1 and WL3 to WL6. That is, a physical page which corresponds to the second word line WL2 of the second plane may be selected by adjusting voltages on the string selection lines SSL1a, SSL1b, SSL2a, and SSL2b and the word lines WL1 to WL6. A write or read operation may be performed with respect to memory cells MC2 in the selected physical page.

In the memory block BLKa, the memory cells MC1 to MC6 may be erased by the memory block or by the sub-block. When erasing is performed by the memory block, all memory cells MC in the memory block BLKa may be simultaneously erased according to an erase request (e.g., an erase request from an external memory controller). When erasing is performed by the sub-block, a portion of memory cells MC1 to MC6 in the memory block BLKa may be simultaneously erased according to an erase request (e.g., an erase request from an external memory controller), and the other thereof may be erase-inhibited. A low voltage (e.g., a ground voltage or a low voltage of which the level is similar to that of the ground voltage) may be supplied to a word line connected to memory cells MC to be erased, and a word line connected to erase-inhibited memory cells MC may be floated.

In some example embodiments, the memory block BLKa may include a physical storage space which is distinguished by a block address. Each of the word lines WL1 to WL6 may correspond to a physical storage space which is distinguished by a row address. Each of the bit lines BL1 and BL2 may correspond to a physical storage space which is distinguished by a column address. Each of string selection lines SSL1a and SSL2a or SSL1b and SSL2b in different rows of each of the ground selection lines GSL1 and GSL2 in different rows may correspond to a physical storage space which is identified by a plane address.

The memory block BLKa shown in FIG. 15 is exemplary. However, the scope and spirit of the inventive concepts may not be limited thereto. For example, the number of rows of cell strings may increase or decrease. As the number of rows of cell strings is changed, the number of string or ground selection lines and the number a cell strings corrected to a bit line may also be changed.

The number of columns of cell strings may increase or decrease. As the number of columns of cell strings is changed, the number of bit lines connected to columns of cell strings and the number of cell strings connected to a string selection line may also be changed.

A height of the cell strings may increase or decrease. For example, the number of ground selection transistors, memory cells, or string selection transistors that are stacked in each, cell string may increase or decrease.

In some example embodiments, memory cells MC in a physical page may correspond to at least three logical pages. For example, k bits (k being an integer of 2 or more) may be programmed in a memory cell MC. In memory cells MC of one physical page, k logical pages may be implemented with k bits programmed in each of the memory cells MC.

For example, a physical page may include a physical storage space which is distinguished by a block address, a row address, a column address, and a plane address. One physical page may include two or more logical pages. Each of the logical pages may include a logical storage space which is distinguished by an additional address (or all offset) for identifying logical pages as well as an address of a physical address.

In some embodiments of the present inventive concepts, a three dimensional (3D) memory array may be provided. The 3D memory array may be monolithically formed in one or more physical levels of arrays of memory cells having an active area disposed above a silicon substrate and circuitry associated with the operation of those memory cells. Such associated circuitry may be above or within such substrate. The term "monolithic" means that layers of each level of the array may be directly deposited on the layers of each underlying level of the 3D memory array.

In some embodiments of the present inventive concepts, the 3D memory array may include vertical NAND strings that are vertically oriented such that at least one memory cell is located over another memory cell. The at least one memory cell may comprise a charge trap layer. Each vertical NAND string may further include at least one selection transistor placed over the memory cells. The at least one selection transistor may have the same structure as the memory cells and may be formed uniformly with the memory cells.

A composition where the 3D memory array is constructed in a plurality of levels and word lines or bit lines between the levels are shared is disclosed in U.S. Pat. Nos. 7,679,133, 8,553,466, 8,654,587 and 8,559,235, and U.S. Patent Publication No. US2011/0233648, which are incorporated by reference in their entirety in the present disclosure.

Figure 16:
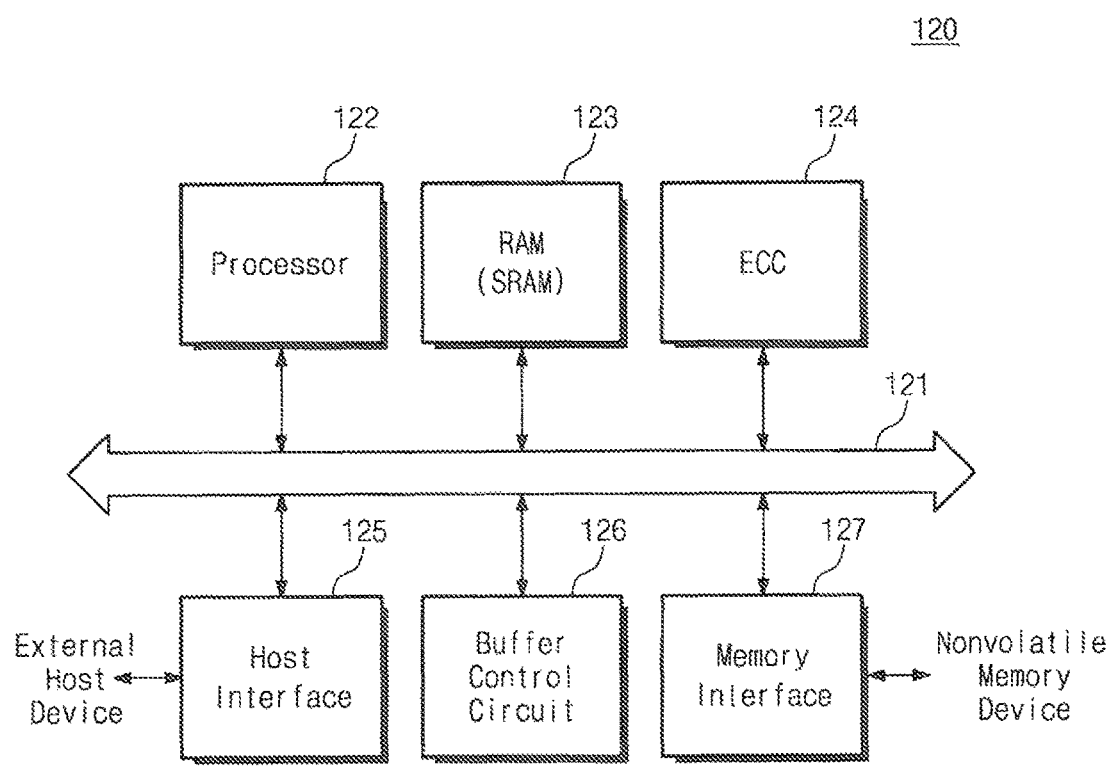
FIG. 16 is a block diagram schematically illustrating a controller package according to example embodiments of the inventive concepts.

FIG. 16 is a block diagram schematically illustrating a controller package 120 according to example embodiments of the inventive concepts. Referring to FIGS. 13 and 16, a controller package 120 may include a bus 121, a processor 122, a RAM 123, an ECC block 124, a host interface 125, a buffer control circuit 126, and a memory interface 127.

The bus 121 may be configured to provide a channel among components of the controller package 120.

The processor 122 may control an overall operation of the controller package 120 and may execute a logical operation. The processor 122 may communicate with an external host device through the host interface 125, may communicate with the nonvolatile memory package 110 through the memory interface 127, and may communicate with the RAM 130 through the buffer control circuit 126. The processor 122 may control the storage device 100 using the RAM 123 as a working memory, a cache memory, and/or a buffer memory.

The RAM 123 may be used as a working memory, a cache memory, and/or a buffer memory of the processor 122. The RAM 123 may store codes or Commands that the processor 122 will execute. The RAM 123 may store data processed by the processor 122. The RAM 123 may include a static RAM (SRAM).

The ECC block 124 may perform an error correction operation. The ECC block 124 may perform error correction encoding based on data to be written at the nonvolatile memory package 110 through the memory interface 127. The error correction encoded data may be transferred to the nonvolatile memory package 110 through the memory interface 127. The ECC block 124 may perform error correction decoding on data received through the memory interface 127 from the nonvolatile memory package 110. In some example embodiments, the ECC block 124 may be included in the memory interface 127 as a component of the memory interface 127.

The host interface 125 may communicate with the external host device under control of the processor 122. The host interface 125 may convey communications using at least one of various communication manners, such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a Secure Digital (SD), a multimedia card (MMC), an embedded MMC (eMMC), a dual in-line memory module (DIMM), a registered DIMM (RDIMM), a load reduced DIMM (LRDIMM), and the like.

The buffer control circuit 126 may control the RAM 130 under control of the processor 122.

The memory interface 127 may communicate with the nonvolatile memory package 110 in response to control of the processor 122. As described with reference to FIG. 1, the memory interface 127 may convey a command, an address, and/or than to the nonvolatile memory package 110 through the input/output channel. The memory interface 127 may convey a control signal to the nonvolatile memory package 110 through the control channel.

In some example embodiments, the processor 122 may control the controller package 120 using codes. The processor 122 may load codes from a nonvolatile memory (e.g., a read only memory) that is implemented in the controller 120. Alternatively, the processor 122 may load codes from the nonvolatile memory package 110 through the memory interface 127.

In some example embodiments, a bus 121 of the controller package 120 may be divided into a control bus and a data bus. The data bus may transmit data in the controller package 120 and the control bus may transmit control information such as a command, address, and the like. The data bus and the control bus may be independent of each other to prevent mutual interference or influence. The data bus may be connected with the host interface 125, the buffer control circuit 126, the ECC block 124, and the memory interface 127. The control its may be connected with the host interface 125, the processor 122, the buffer control circuit 126, the RAM 123, and the memory interface 127.

According to some example embodiments of the inventive concepts, static electricity occurring in cutting the printed circuit board may be discharged through the electrostatic discharge pattern. Accordingly, the semiconductor packages mounted on the printed circuit board may be protected from being damaged without a design change of an area where the semiconductor packages are formed, thereby improving reliability and yield of the device which is manufactured in the printed circuit board.

While the inventive concepts have been described with reference to example embodiments, it will be apparent to those skilled in the art that various changes and modifications may be made without deputing from the spirit and scope of the inventive concepts. Therefore, it should be understood that the above embodiments are not limiting, but illustrative.

What is claimed is:

1. A printed circuit board comprising a plurality of insulation layers and a plurality of pattern layers alternately stacked,
   wherein the printed circuit board comprises a plurality of device areas on which semiconductor packages are mounted and a peripheral area that is adjacent the plurality of device areas,
   wherein an electrostatic discharge pattern is in a first pattern layer among the plurality of pattern layers and is at a boundary region that is between a first device area of the plurality of device areas and the peripheral area,
   wherein the first pattern layer is disposed between two insulation layers of the plurality of insulation layers in a direction perpendicular to an upper surface of the printed circuit board,
   wherein the electrostatic discharge pattern is configured to discharge an electric charge associated with at least one of the plurality of pattern layers or at least one of the plurality of insulation layers during a cutting operation of the printed circuit board, and
   wherein the electrostatic discharge pattern comprises a portion having a comb shape which extends toward the first device area from the peripheral area.

2. A printed circuit board comprising:
a plurality of insulation layers and a plurality of pattern layers alternately stacked;
at least one device area on which a semiconductor package is mounted;
a peripheral area that is adjacent the at least one device area;
a bridge area connecting the at least one device area to the peripheral area; and
an electrostatic discharge pattern in the bridge area,
wherein at least one of the plurality of insulation layers is between a first pattern layer of the plurality of pattern layers and an upper surface of the printed circuit board in a direction perpendicular to the upper surface of the printed circuit board,
wherein the electrostatic discharge pattern is in the first pattern layer,
wherein the electrostatic discharge pattern is configured to discharge a static electric charge occurring during a cutting operation of the printed circuit board, and
wherein the electrostatic discharge pattern is in a shape of a triangle such that a width of the electrostatic discharge pattern increases as the electrostatic discharge pattern extends toward the at least one device area from the peripheral area.

3. A printed circuit board comprising:
a plurality of insulation layers and a plurality of pattern layers alternately stacked;
at least one device area on which a semiconductor package is mounted;
a peripheral area that is adjacent the at least one device area;
a bridge area connecting the at least one device area to the peripheral area; and
an electrostatic discharge pattern in the bridge area,
wherein at least one of the plurality of insulation layers is between a first pattern layer of the plurality of pattern layers and an upper surface of the printed circuit board in a direction perpendicular to the upper surface of the printed circuit board,
wherein the electrostatic discharge pattern is in the first pattern layer,
wherein the electrostatic discharge pattern is configured to discharge a static electric charge occurring during a cutting operation of the printed circuit board, and
wherein the electrostatic discharge pattern is in a shape of a semicircle such that a width of the electrostatic discharge pattern increases as the electrostatic discharge pattern extends toward the at least one device area from the peripheral area.

* * * * *